(12) United States Patent
Sakai et al.

(10) Patent No.: US 6,501,084 B1
(45) Date of Patent: Dec. 31, 2002

(54) LAMP UNIT USING SHORT-WAVE LIGHT EMITTING DEVICE

(75) Inventors: Kazuhiro Sakai, Gifu-ken (JP); Toshio Takahashi, Kuwana (JP); Takao Mukogawa, Bisai (JP); Tadanobu Iwasa, Ichinomiya (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 0 days.

(21) Appl. No.: 09/538,946

(22) Filed: Mar. 31, 2000

(30) Foreign Application Priority Data

Mar. 31, 1999 (JP) ............................ 11-091621
Jan. 12, 2000 (JP) ........................ 2000-004027

(51) Int. Cl.$^7$ ................................................. G01J 1/00
(52) U.S. Cl. ................................................. 250/504 R
(58) Field of Search ....................... 362/249; 250/504 R

(56) References Cited

U.S. PATENT DOCUMENTS

| | | | | |
|---|---|---|---|---|
| 4,959,585 A | * | 9/1990 | Hoegler et al. | 313/271 |
| 5,632,551 A | * | 5/1997 | Roney et al. | 362/249 |
| 5,726,535 A | * | 3/1998 | Yan | 362/240 |
| 6,227,679 B1 | * | 5/2001 | Zhang et al. | 362/800 |
| 6,391,809 B1 | * | 5/2002 | Young | 501/15 |
| 2001/0046081 A1 | * | 11/2001 | Hayashi et al. | 359/296 |
| 2002/0014673 A1 | * | 2/2002 | Leedy | 257/419 |

FOREIGN PATENT DOCUMENTS

EP          1100113 A2   *  5/2001  ............ G21K/5/00

OTHER PUBLICATIONS

Patent Abstracts of Japan, English Abstract of Japanese Laid Open Patent Publication (Kokai) No. 9–8361, Jan. 10, 1997.

* cited by examiner

*Primary Examiner*—Jack Berman
*Assistant Examiner*—Johnnie L Smith, II
(74) *Attorney, Agent, or Firm*—Pillsbury Winthrop LLP

(57) ABSTRACT

A short-wave light transmitting diode lamp unit has a printed circuit board disposed in a housing. A plurality of short-wave light emitting diode chips is mounted on the printed circuit board so that a light emission side of the light emitting diode chip faces an opening of the housing. An outer glass as a light transmitting plate is attached to the opening of the housing. The outer glass is made of a glass material having high ultraviolet ray transmittance. The outer glass is prevented from degradation caused by the ultraviolet rays. Thus, the light output efficiency is kept in good level and long lifetime is assured. An overall structure becomes simple, thereby reducing the production costs.

11 Claims, 10 Drawing Sheets

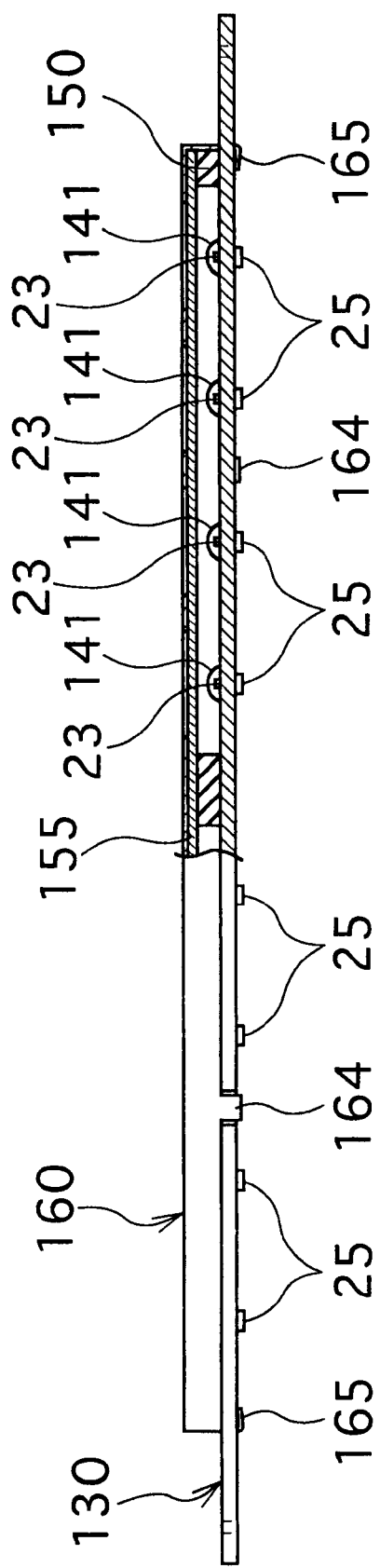

LAMP UNIT USING SHORT-WAVE LIGHT EMITTING DEVICE

BACKGROUND OF THE INVENTION

1. Field of the Invention

This invention relates to a lamp unit using a light emitting diode (LED) that emits short-wave light, particularly to an ultraviolet (UV) lamp unit having many short-wave LEDs mounted on a printed circuit board.

2. Description of the Related Art

A short-wave LED emits the light of short-wave range not more than 400 nm or ultraviolet rays. Such LED is used for fluorescent light emission, exciting a photocatalyst and so on. A sealed lamp or a hermetically sealed lamp may be exemplified as such short-wave LED lamp. The sealed lamp has an LED chip emitting light of short-wave range. The LED is mounted on a reflector disc of a lead frame. The disc and LED chip are sealed with a resin mold, i.e. a plastic cover or plastic lens, which is made of a transparent resin such as an epoxy resin or acrylic resin. The resin mold protects the LED chip and so on from a mechanical shock and the like. The hermetically sealed lamp has short-wave LED chips mounted on a reflector disc of a metal stem. Then, a metallic glass can is fixed on the disc by caulking. The glass can protects the LED chips and so on from a mechanical shock and the like. The glass can have an upper side made of glass so as to transmit light emitted from the LED chips. A conventional short-wave LED lamp unit has the above-mentioned short-wave LED lamps mounted in multiplicity on a printed circuit board at fixed positions. Then, it provides a required light output or luminance.

However, with respect to the conventional sealed lamp, the resin mold absorbs ultraviolet rays radiated from the short-wave LED and is degraded. Consequently, the light output is lowered and the luminance is decreased. There has not been developed yet any resin mold that is free from degradation caused by the UV rays. Therefore, the LED lamp unit constituted from the sealed lamps could be improved in view of the lifetime. On the other hand, in case of the hermetically sealed lamp, the parts such as the metal stem and glass can are expensive, thereby increasing the total costs. Then, the LED lamp unit constituted from the hermetically sealed lamp could be improved in view of the costs.

BRIEF SUMMARY OF THE INVENTION

An object of the present invention is to provide a short-wave LED lamp unit that is free from a problem of degradation caused by UV ray absorption so as to prevent the light output efficiency from lowering while assuring a lifetime enough long, and that can simplify overall structure so as to decrease production costs thereof.

According to a first aspect of the invention, a short-wave light emitting diode lamp unit comprises a printed circuit board on which electronic parts are mountable. A plurality of short-wave light emitting diode chips is mounted on the printed circuit board. A housing accommodates therein the printed circuit board and the short-wave light emitting diode chips, while having a light transmitting portion provided at least at a location facing a light emission side of the short-wave light emitting diode chip. The light transmitting portion is made of a glass material having high ultraviolet ray transmittance.

According to a second aspect of the invention, a short-wave light emitting diode lamp unit comprises a housing having an opening and a printed circuit board on which electronic parts are mountable. The printed circuit board is disposed inside the housing. A plurality of short-wave light emitting diode chips is mounted on the printed circuit board so that a light emission side of the short-wave light emitting diode chip faces the opening of the housing. A light transmitting plate is attached to the opening of the housing. The light transmitting plate is made of a glass material having high ultraviolet ray transmittance.

According to a third aspect of the invention, a short-wave light emitting diode lamp unit comprises a printed circuit board on which electronic parts are mountable. A plurality of short-wave light emitting diode chips is mounted on the printed circuit board. A housing accommodates therein the printed circuit board and the short-wave light emitting diode chips. The housing is made of a glass material having high ultraviolet ray transmittance into a tube shape.

According to a third aspect of the invention, a short-wave light emitting diode lamp unit comprises a printed circuit board on which electronic parts are mountable. A plurality of short-wave light emitting diode chips is mounted on the printed circuit board. A resin mold coats the short-wave light emitting diode chip. The resin mold has high ultraviolet ray transmittance.

Further objects and advantages of the invention will be apparent from the following description, reference being had to the accompanying drawings, wherein preferred embodiments of the invention are clearly shown.

BRIEF DESCRIPTION OF THE SEVERAL VIEWS OF THE DRAWINGS

FIG. 13 is a side view, cut away in part, showing the eighth embodiment of LED lamp unit.

DETAILED DESCRIPTION OF THE INVENTION

Figure 1:
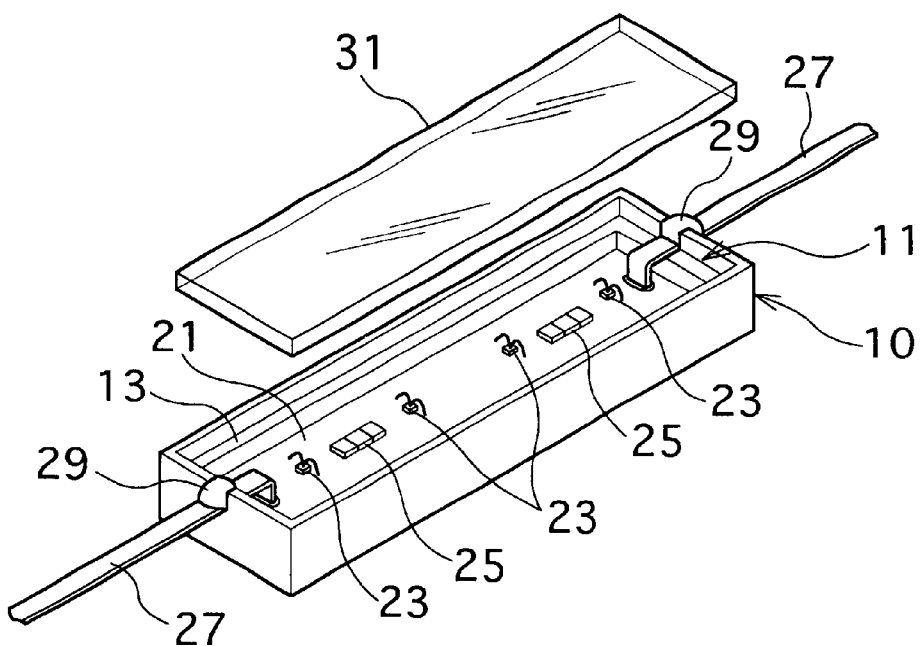
FIG. 1 is a perspective view showing a short-wave LED lamp unit with an outer glass disassembled therefrom according to a first embodiment of the invention.

Several embodiments of the invention are described hereunder referring to the attached drawings. The same reference character is attached to the same member or element throughout the several embodiments to avoid redundancy.

Figure 2:
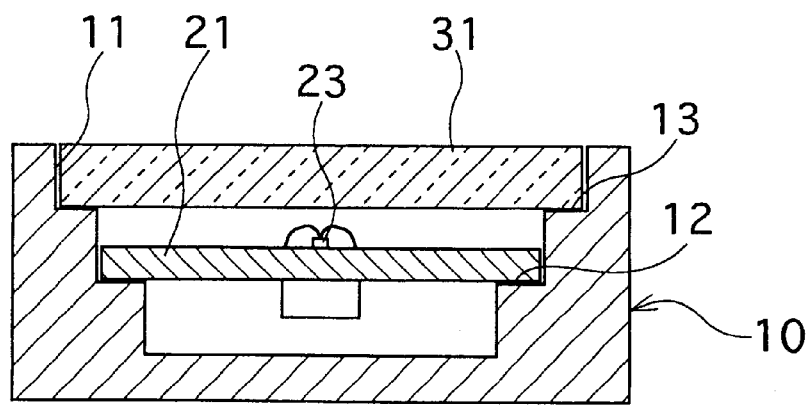
FIG. 2 is a cross-sectional view showing the first embodiment of LED lamp unit.
Figure 3:
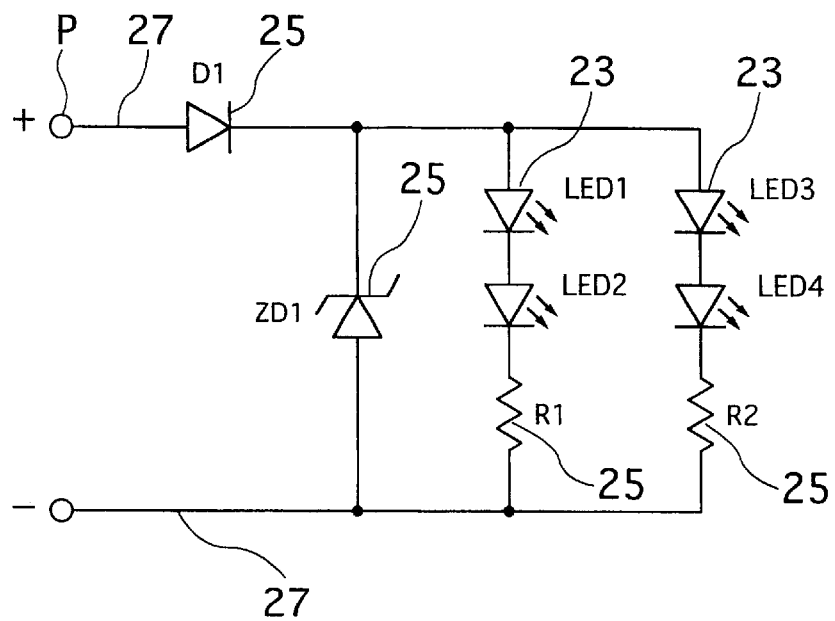
FIG. 3 is a diagram showing a circuitry of the first embodiment of LED lamp unit.

FIG. 1 illustrates a short-wave LED lamp unit with an outer glass disassembled therefrom according to a first embodiment of the invention. FIG. 2 illustrates a cross-section of the first embodiment of LED lamp unit. FIG. 3 illustrates a circuitry of the first embodiment of LED lamp unit.

Referring to FIGS. 1 and 2, the first embodiment of LED lamp unit has a housing 10 on which an opening 11 is formed. The housing 10 has an elongate and thin rectangular parallelepiped box shape. The opening 11 is formed on one thickness end (upper end in FIG. 2) of the housing 10. The housing 10 has a symmetrical stepped cross-section with first steps 12 and second steps 13 disposed at opposite sides in a width direction (right and left in FIG. 2) in an inside thereof. A printed circuit board (PCB) 21 is disposed inside the housing 10. The PCB 21 has an elongate rectangular plate shape corresponding to the housing 10. Electronic parts can be mounted on the PCB 21. The PCB 21 has right and left ends placed and fixed on the opposite first steps 12 of the housing 10.

Plural or four short-wave LED chips 23 are mounted on an upper side of the PCB 21 so that its light emitting side is opposed to the opening 11 of the housing 10. The LED ships 23 are disposed at predetermined intervals in the longitudinal direction of the PCB 21. The LED chip 23 itself is well known and emits light of a fixed UV range, e.g. UV rays of a wavelength from 360 to 400 nm. A gallium-nitride LED can be used as such short-wave LED chip 23, for example. In addition, several electrical elements 25 are mounted on the upper side of the PCB 21, such as resistors R1, R2, diode D1, and zener diode ZD1. A pair of leads 27 is taken out of the front and rear ends of the PCB 21. The lead 27 may have a quadrilateral or round cross section. The leads 27 ride over the front and rear ends of the upper side of the housing 10 so as to extend in the longitudinal direction. An external power source P supplies power to the LED chips 23 and other electrical elements 25 via the leads 27. The leads 27 are secured to the front and rear ends of the upper side of the housing 10 by an adhesive 29.

An outer glass 31 is attached to the opening 11 of the housing 10. The outer glass 31 is made of a glass material of high UV ray transmittance. In detail, the outer glass 31 is formed of an inorganic glass, such as boro-silicate glass, into an elongate rectangular plate shape corresponding to the opening 11. The outer glass 31 has right and left ends placed and fixed on the second steps 13 of the housing 10 so as to wholly cover the opening 11 from the outside.

As shown in FIG. 3, the LED unit according to the first embodiment connects two short-wave LED chips 23 (LED1 and LED2) and two short-wave LED chips 23 (LED3 and LED4) in parallel to the external power source P. The power source P feeds power to the LED chips 23 via the diode D1. The resistor R1, R2 is connected to a cathode of each pair of LED chips 23 (LED1 and LED2: LED3 and LED4). The zener diode ZD1 is connected between an anode and cathode of the LED chips 23 (LED1–LED4) for the purpose of preventing trouble of the LED chip 23 caused by static electricity or the like.

An operation of the LED lamp unit according to the first embodiment is described hereunder.

With the first embodiment of short-wave LED lamp unit, the UV rays emitted from the LED chips 23 go through the outer glass 31 of the housing 10. The outer glass 31 is hardly degraded due to the UV ray absorption, since it is made of the glass material having high UV ray transmittance. Thus, the light output or light output efficiency of the LED chip 23 does not decrease.

Required number of LED chips 23 are mounted directly on the PCB 21 to make one body. Therefore, the LED lamp unit needs less costs and has a simple structure compared with the conventional one in which short-wave LED lamps such as the sealed lamps or hermetically sealed lamps are mounted on the PCB. Moreover, since the LED lamp unit has a simple and compact structure, it can be used for general purpose more. Namely, the LED lamp can be applied to a variety of devices, e.g. a light source for exciting a photocatalyst, optical sensor, light source for fluorescent display and the like.

The LED lamp unit provides the outer glass 31 as a high insulation material at the light emitting side of the LED chips 23. Thus, it can prevent trouble of the LED chips 23 caused by the static electricity or the like. Consequently, in contrast to the conventional art that needs one zener diode per one LED, the first embodiment of LED lamp unit needs only one zener diode per one lamp unit or one PCB. As a result, it is possible to decrease the number of zener diodes for preventing trouble of the LED chips 23, thereby lowering the production costs more.

The PCB 21 and LED chips 23 are accommodated in the housing and sheltered by the mechanical shock or the like, thereby prevented from deformation or trouble.

Therefore, the short-wave LED lamp unit is free from a problem of degradation caused by the UV ray absorption, thereby keeping the light output efficiency from lowering while assuring a lifetime enough long. Moreover, it can simplify an overall structure so as to decrease production costs thereof. Namely, the LED lamp unit precludes the degradation of the resin mold by the UV rays and maintains the light output level, in contrast with the conventional art using the sealed lamps. In addition, the LED lamp unit is inexpensive compared with the conventional art using the hermetically sealed lamps.

Particularly, the first embodiment of LED lamp has the opening 11 formed on the housing 10 and the outer glass 31 fitted to the opening 11. Therefore, the integrally joined PCB 21 and LED chips 23 can be easily fixed to the inside of the housing 10. Thereafter, the outer glass 31 is fitted to the opening 11. Thereby, the outer glass 31 shields the PCB 21 and the like from the outside. Consequently, the overall structure is simple and total costs are decreased.

Figure 4:
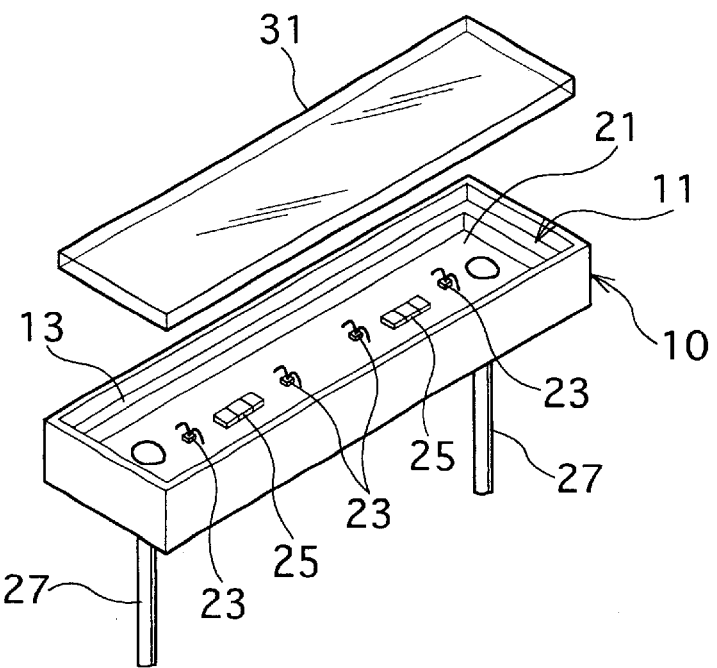
FIG. 4 is a perspective view showing a short-wave LED lamp unit with an outer glass disassembled therefrom according to a second embodiment of the invention.

FIG. 4 illustrates a short-wave LED lamp unit with an outer glass disassembled therefrom according to a second embodiment of the invention.

The second embodiment of short-wave LED lamp unit is different from the first embodiment of LED lamp unit in a direction in which the leads 27 are taken out. The other structure is the same. Specifically, the second embodiment of LED lamp unit has the leads 27 extended from the lower surface of the PCB 21. The leads 27 go through the bottom of the housing 10 at the front and rear ends of the PCB 21. Then, the leads 27 are taken out downward.

The LED lamp unit according to the second embodiment operates in the same manner and has the same advantages as the first embodiment.

Figure 5:
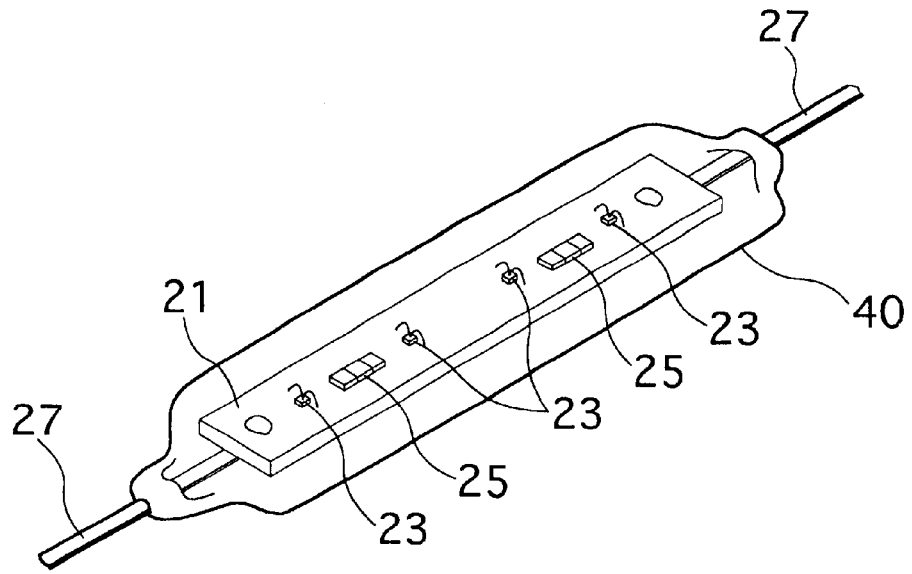
FIG. 5 is a perspective view showing a short-wave LED lamp unit according to a third embodiment of the invention.

FIG. 5 illustrates a short-wave LED lamp unit according to a third embodiment of the invention.

The third embodiment of LED lamp unit is different from the first embodiment of LED lamp unit mainly in a structure of a housing. The other structure is the same. Specifically, the LED lamp unit according to the third embodiment has a housing 40 in a shape of a glass tube. The housing 40 is made of a glass material of high UV ray transmittance. Therefore, the housing 40 is transparent as a whole. The housing 40 accommodates therein the PCB 21 that has the short-wave LED chips 23 and the like integrally mounted thereon. A pair of leads 27 is taken out of the front and rear ends of the housing 40. The leads 27 extend in the longitudinal direction of the housing 40. More in detail, in the third embodiment, the housing 40 has a flattened or oblate tube shape with contracted or tapered front and rear ends from which the leads 27 are taken out.

The third embodiment of LED lamp unit substitutes part of the glass housing 40 for the outer glass 31 of the first embodiment. The housing 40 is made of the high UV ray transmitting glass material as in the light transmitting portion or outer glass 31 of the first embodiment. Accordingly, the third embodiment of LED lamp unit operates in the same manner and has the same advantages as the first embodiment.

Moreover, the LED lamp unit has the housing 40 made of glass tube, so that the housing 40 is simple in structure. Furthermore, the integrated PCB 21 and LED chips 23 can be easily disposed inside the housing 40 at the time of forming the housing 40, for example. In addition, the PCB 21 and the like in the housing 40 are shielded from the outside simultaneously with forming the housing 40. Consequently, the overall structure becomes simple and the production costs decrease.

Figure 6:
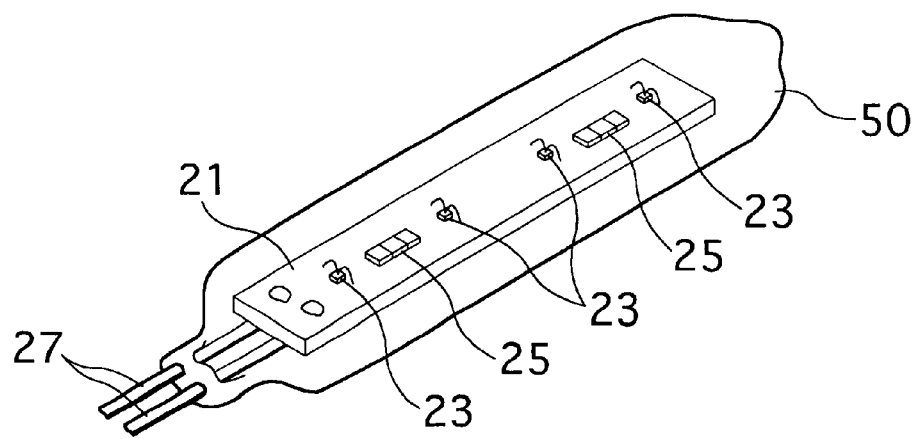
FIG. 6 is a perspective view showing a short-wave LED lamp unit according to a fourth embodiment of the invention.

FIG. 6 illustrates a short-wave LED lamp unit according to a fourth embodiment of the invention.

The fourth embodiment of LED lamp unit is different from the third embodiment of LED lamp unit in a structure of a housing. The other structure is the same. Specifically, the LED lamp unit has a housing 50 of a glass tube made of a glass material of high UV ray transmittance as in the third embodiment. In contrast, a pair of leads 27 is taken out of one end (front end) of the housing 50 in the same direction so as to extend forward. Namely, in the fourth embodiment, the housing 50 has a flattened or oblate tube shape with the contracted front and rear ends. However, the leads 27 are taken out of the front end only.

The fourth embodiment of LED lamp unit operates in the same manner and has the same advantages as the third embodiment.

Figure 7:
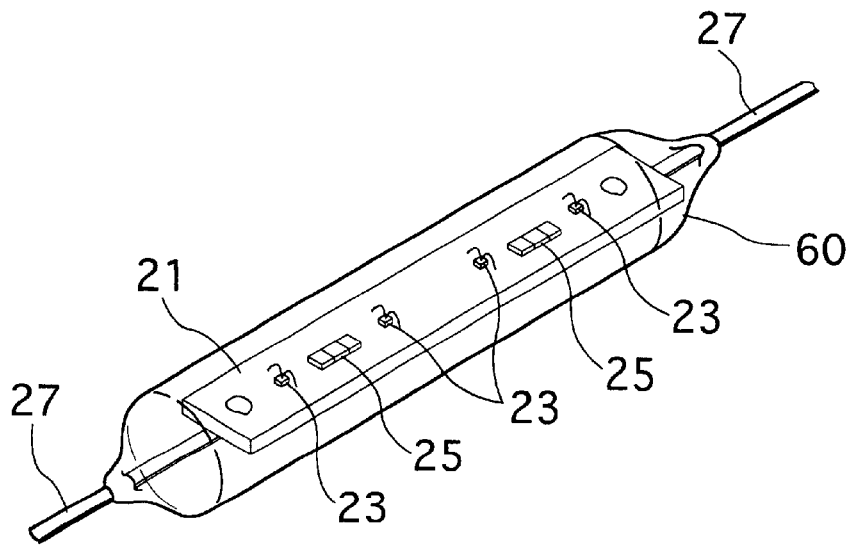
FIG. 7 is a perspective view showing a short-wave LED lamp unit according to a fifth embodiment of the invention.
Figure 8:
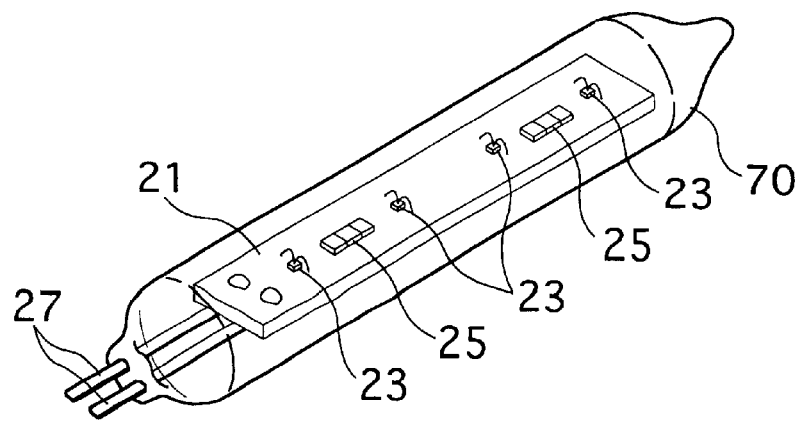
FIG. 8 is a perspective view showing a short-wave LED lamp unit according to a sixth embodiment of the invention.

The third and fourth embodiments as constructed above may have another shape of housing. FIG. 7 illustrates a short-wave LED lamp unit according to a fifth embodiment of the invention. FIG. 8 illustrates a short-wave LED lamp unit according to a sixth embodiment of the invention.

The third embodiment of housing 40 is the oblate tube with contracted opposite ends from which the leads 27 are taken out, respectively. In contrast, as shown in FIG. 7, the fifth embodiment of housing 60 is a cylindrical tube with contracted opposite ends from which the leads 27 are taken out, respectively.

The fourth embodiment of housing 50 is the oblate tube with contracted opposite ends, while the leads 27 are taken out from the front end. In contrast, as shown in FIG. 8, the sixth embodiment of housing 70 is a cylindrical tube with contracted opposite ends, while the leads 27 are taken out from the front end.

The short-wave LED lamp unit according to the fifth or sixth embodiment operates in the same manner and has the same advantages as the third or fourth embodiment.

Figure 9:
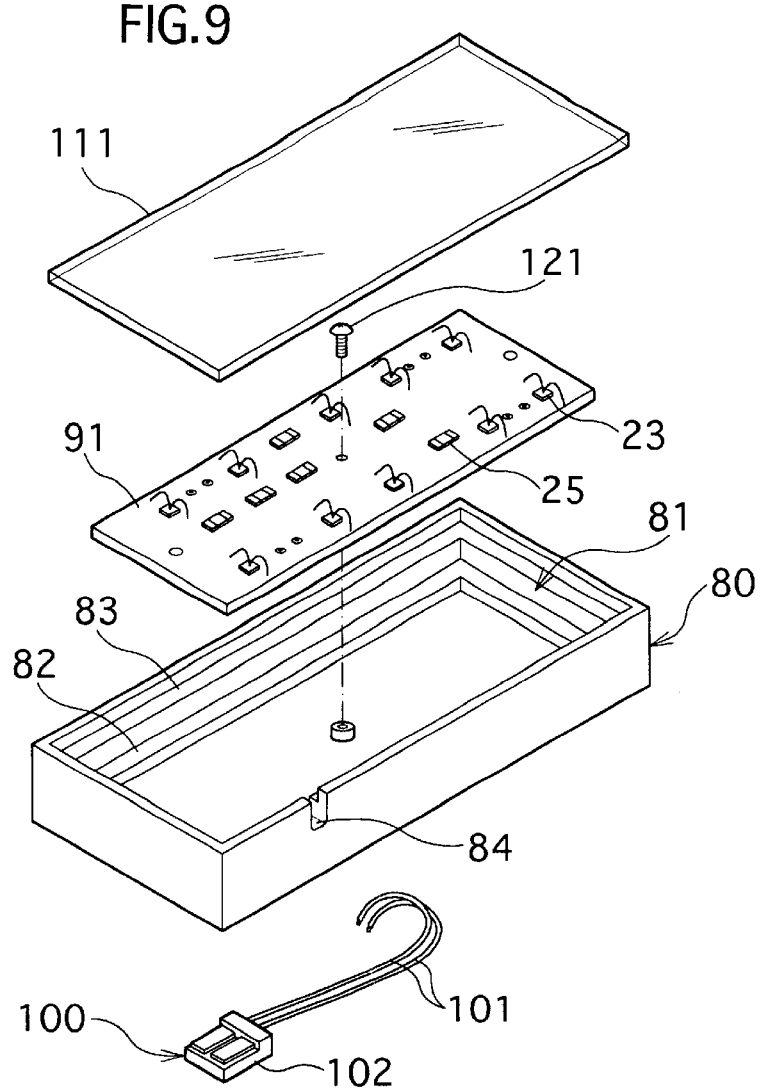
FIG. 9 is an exploded perspective view showing a short-wave LED lamp unit according to a seventh embodiment of the invention.
Figure 10:
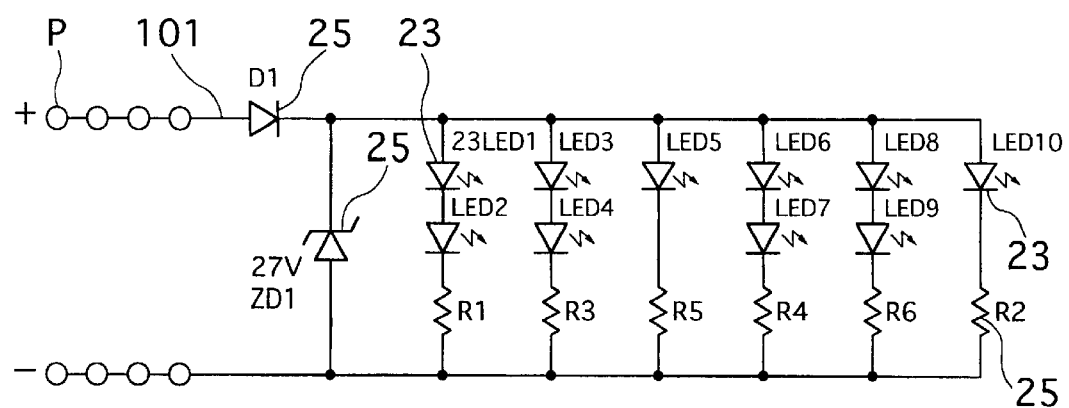
FIG. 10 is a diagram showing a circuitry of the seventh embodiment of LED lamp unit.

FIG. 9 illustrates a short-wave LED lamp unit according to a seventh embodiment of the invention. FIG. 10 illustrates a circuitry of the seventh embodiment of LED lamp unit.

The seventh embodiment of LED lamp unit is structured in a similar way as the first embodiment of LED lamp unit, but has a larger size as a whole so as to mount more short-wave LED chips 23. Specifically, as shown in FIG. 9, the LED lamp unit has a housing 80 with an opening 81. The housing 80 has an elongate and thin rectangular parallelepiped box shape that is wider than the housing 10 of the first embodiment. The opening 81 is formed on an upper side of the housing 80. The housing 80 has a symmetrical stepped cross-section with first steps 82 and second steps 83 disposed at opposite sides in a width direction like the housing 10 of the first embodiment. A printed circuit board (PCB) 91 is disposed inside the housing 80. The PCB 91 has an elongate rectangular plate shape corresponding to the housing 80. The PCB 91 has right and left ends placed and fixed on the opposite first steps 82 of the housing 80.

Plural or ten short-wave LED chips 23 are mounted on an upper side of the PCB 91 so that its light emission side is opposed to the opening 81 of the housing 80. The LED chips 23 are disposed in two lines on lateral both sides of the PCB 91, each line of which has five LED chips 23 arranged at predetermined intervals in the longitudinal direction of the PCB 91. In addition, several electrical elements 25 are mounted on the upper side of the PCB 91, such as resistors R1–R6, diode D1, and zener diode ZD1. A cutout 84 is formed on one lateral side of the housing 80. Leads 101 of a harness 100 are taken out of the cutout 84. The harness 100 has one end of the lead 101 electrically connected to the PCB 91. A terminal 102 is connected to the external power source P so that the power is fed to the LED chips 23 and other electrical elements 25.

An outer glass 111 as a light transmitting plate is fitted into the opening 81 of the housing 80. The outer glass 111 is made of a glass material of high UV ray transmittance. The outer glass 111 is formed in the same manner as the outer glass 31 of the first embodiment. The outer glass 111 has right and left ends placed and fixed on the second steps 83 of the housing 80 so that it wholly covers the opening 81 from the outside. The PCB 91 is secured to the housing 80 via screws 121.

Referring to FIG. 10, the LED lamp unit according to the seventh embodiment connects two short-wave LED chips 23 (LED1 and LED2), two short-wave LED chips 23 (LED3 and LED4), one short-wave LED chip 23 (LED5), two short-wave LED chips 23 (LED6, LED7), two short-wave LED chips 23 (LED8, LED9) and one short-wave LED chip 23 (LED 10) in parallel to the external power source P. The power source P feeds power to the LED chips 23 via the diode D1. The resistor R1, R3, R5, R4, R6, R2 is connected to a cathode of each of the two short-wave LED chips 23 (LED1 and LED2), two short-wave LED chips 23 (LED3 and LED4), one short-wave LED chip 23 (LED5), two short-wave LED chips 23 (LED6, LED7), two short-wave LED chips 23 (LED8, LED9) and one short-wave LED chip 23 (LED 10). The zener diode ZD1 is connected between an anode and cathode of the LED chips 23 (LED1–LED10).

The short-wave LED lamp unit according to the seventh embodiment operates in the same manner and has the same advantages as the first embodiment. Moreover, with the LED lamp unit according to the seventh embodiment, more number of LED chips can be mounted. Thus, the LED lamp unit is applicable to a device having a larger size.

With the first, second and seventh embodiments of LED lamp units constructed as described above, the UV rays emitted from the short-wave LED chips 23 go through the outer glass 31, 111 as the light transmitting plate of the housing 10, 80. The outer glass 31, 111 is hardly degraded by absorbing the UV rays, since it is made of the high UV ray transmitting glass material. Therefore, it prevents the light output power or light output efficiency from lowering due to UV degradation.

Moreover, since required number of short-wave LED chips 23 are mounted directly on the PCB 21, 91 so as to make one body, the costs are lessened and the structure is simplified in comparison with the case in which the short-wave LED lamps are mounted on the PCB. Furthermore, since the structure is compact and simple, the LED lamp unit can be used for general purpose more. Then, the LED lamp unit has extended applications to the light source for photocatalyst, optical sensor, light source for fluorescent display and so on.

In addition, since the outer glass 31, 111 of high insulation material is disposed at the emission side of the LED chips 23, the LED chips 23 are refrained from trouble caused by the static electricity or the like. Consequently, it is possible to lessen the number of zener diode for preventing trouble of the LED chips 23, thereby reducing the cost much more.

The PCB 21, 91 and LED chips 23 are accommodated in the housing 10, 80 and protected from the mechanical shock or the like. Thus, they can be prevented from deformation or trouble.

As a result, the short-wave LED lamp unit is free from a problem of degradation caused by the UV ray absorption. Then, the light output efficiency is kept from lowering, while the lifetime is maintained enough long. Moreover, overall structure is simplified, so that the production costs decrease. Namely, the LED lamp unit prevents the degradation of the resin mold caused by the UV rays so as to maintain the light output level, in contrast with the conventional art using the sealed lamp. In addition, the LED lamp unit is inexpensive compared with the conventional art using the hermetically sealed lamp.

On the other hand, with the short-wave LED lamp unit according to the third and sixth embodiments constructed as described above, the UV rays emitted from the short-wave LED chips 23 go through the housing 40, 50, 60, 70 in the shape of glass tube. The housing 40, 50, 60, 70 is hardly degraded by absorbing the UV rays, since it is made of the high UV ray transmitting glass material. Therefore, the light output power or light output efficiency is prevented from lowering against the degradation due to the UV rays.

Moreover, since the required number of short-wave LED chips 23 are mounted directly on the PCB 21, 91 so as to make one body, the production costs are lessened and the structure is simplified, in comparison with the case in which the short-wave LED lamps are mounted on the PCB. Furthermore, since the structure is compact and simple, the LED lamp unit can be used for general purpose more. Then, the LED lamp unit has extended applications to the light source for photocatalyst, optical sensor, light source for fluorescent display and so on.

In addition, since the housing 40, 50, 60, 70 of high insulation material is disposed entirely around the LED chips 23 including the emission side thereof, the LED chips 23 are prevented from trouble caused by the static electricity or the like. Consequently, the LED lamp unit is allowed to have less number of zener diode for preventing trouble of the LED chips 23, thereby reducing the production cost much more.

The PCB 21 and LED chips 23 are accommodated in the housing 40, 50, 60, 70 and protected from the mechanical shock or the like. Thus, they can be prevented from deformation or trouble.

As a result, the short-wave LED lamp unit is free from a problem of degradation caused by the UV ray absorption. Thus, the light output efficiency is prevented from lowering and the lifetime is kept enough long. Moreover, the overall structure is simplified, so that the production costs decrease. Namely, the LED lamp unit prevents the degradation of the resin mold caused by the UV rays and maintains the light output level, in contrast with the conventional art using the sealed lamp. In addition, the LED lamp unit is inexpensive compared with the conventional art using the hermetically sealed lamp.

The inventive short-wave LED lamp unit may be embodied in other forms than the above embodiments. Namely, the inventive LED lamp unit may be concretized into any form, as long as it comprises a PCB, plural short-wave LED chips mounted on the PCB and a housing that accommodates therein the PCB and LED chips and that has a light transmitting portion made of a glass material of high UV ray transmittance formed at least at a portion facing the light emission side of the LED chip.

In this case, the light transmitting portion functions or operates in the same way and has the same advantages as the outer glass 31, 111 as the light transmitting plate or the housing 40, 50, 60, 70 in the above embodiments, too.

The inventive LED lamp unit may make the housing 10, 40, 50, 60, 70, 80 airtight and fill the housing 10, 40, 50, 60, 70, 80 with a nitrogen gas, in addition to the structure of the above mentioned embodiments.

In this case, the PCB 21, 91 and LED chips 23 in the housing 10, 40, 50, 60, 70, 80 are not affected by the outside air. Consequently, there are no influences on their electric property and the like, so that they are able to perform stable light emission characteristics. Moreover, the nitrogen gas filling the housing 10, 40, 50, 60, 70, 80 prevents oxidation caused by the UV rays. As a result, in addition to the advantages described in the above embodiments, it is possible to effectively obviate degradation of the LED chips 23 on the PCB 21, 91, electrical elements 25, adhesives for LED chips 23 and the like.

Furthermore, the inventive LED lamp unit may provide a protective film of a transparent resin material having high UV ray transmittance on a surface of the LED chip 23, in addition to the structure of the above mentioned embodiments.

In this case, the protective film keeps safe the surface of the LED chip 23. Moreover, the protective film performs a lens effect similar to that of the plastic lens, thereby improving the light output efficiency, since it is made of the transparent resin material. Furthermore, the protective film is not degraded in itself since it has high UV ray transmittance. As a result, in addition to the advantages of the above embodiments, it is possible to prolong the lifetime and improve the light output efficiency with a simple structural addition of the protective film.

As the protective film, a fluorine-contained polymer or silicone resin is coated on the surface of the LED chip 23 with several micron thickness, for example.

The inventive LED lamp unit may provide a photocatalyst film on the outer surface of the outer glass 31, 111 or housing 10, 40, 50, 60, 70, 80 as the light transmitting portion or plate, in addition to the structure of the above described embodiments.

In this case, the photocatalyst film is excited by the UV rays emitted from the LED chips 23 as a light source so as to carry out its proper function or cleaning effects. Thus, it is possible to automatically remove substances sticking to the outer surface of the outer glass 31, 111 or housing 10, 40, 50, 60, 70, 80. At this time, the LED chips 23 can be used as the light source for exciting the photocatalyst, other than its proper use. As a result, it is possible to prevent dirt of the surface of the outer glass 31, 111 or housing 10, 40, 50, 60, 70, 80, with a simple structural addition of the photocatalyst film. Thus, the light output efficiency is kept at a good level for a long time.

It is preferable to use titanium dioxide (TiO2) as the photocatalyst film, in view that it can be excited by near ultraviolet rays that are harmless to human bodies and in view of costs or the like.

Figure 11:
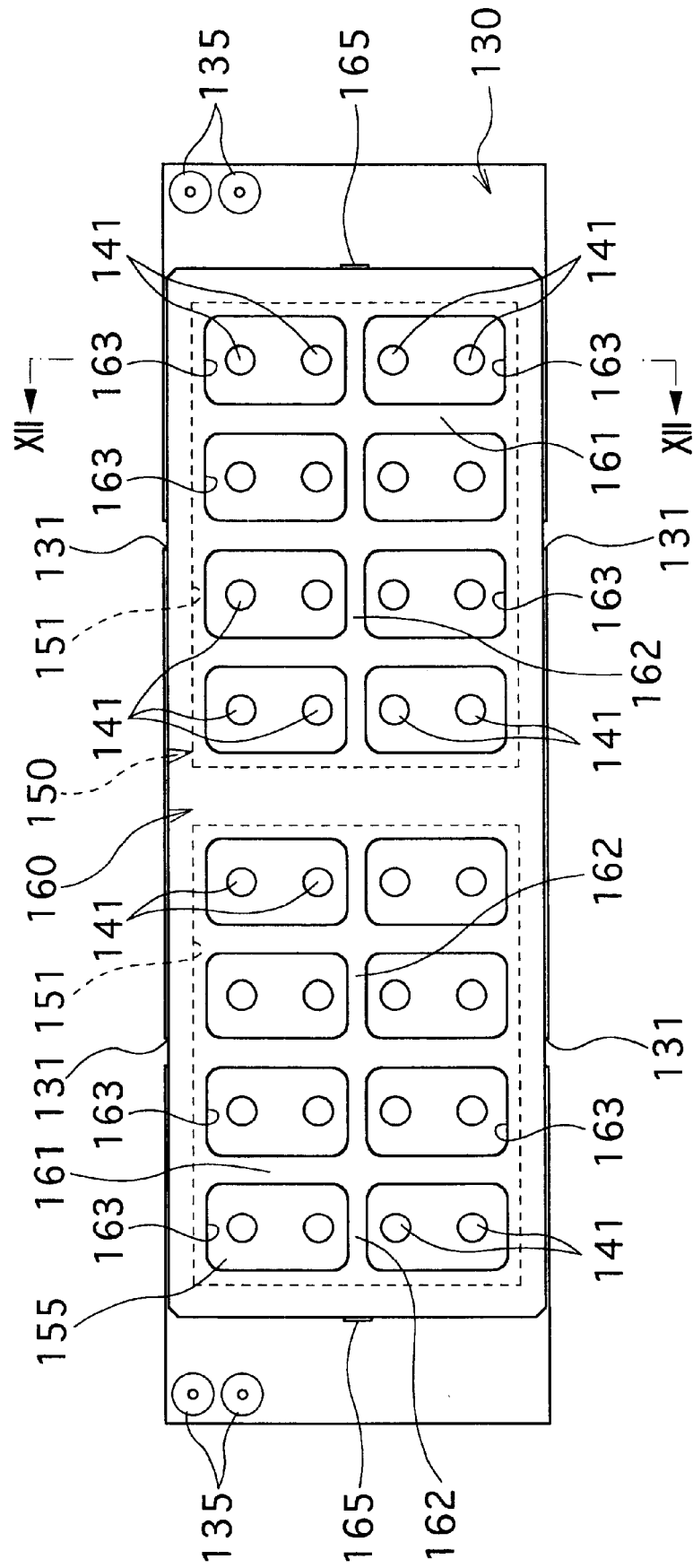
FIG. 11 is a plan view showing a short-wave LED lamp unit according to a eighth embodiment of the invention.
Figure 12:
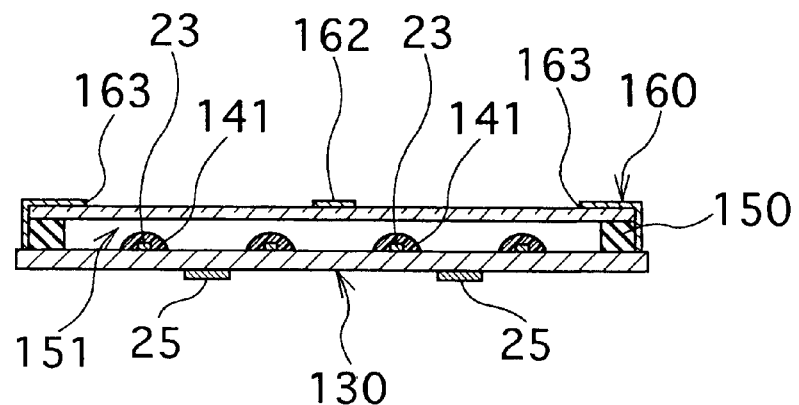
FIG. 12 is a cross-sectional view taken along the line XII—XII of FIG. 11.
Figure 14:
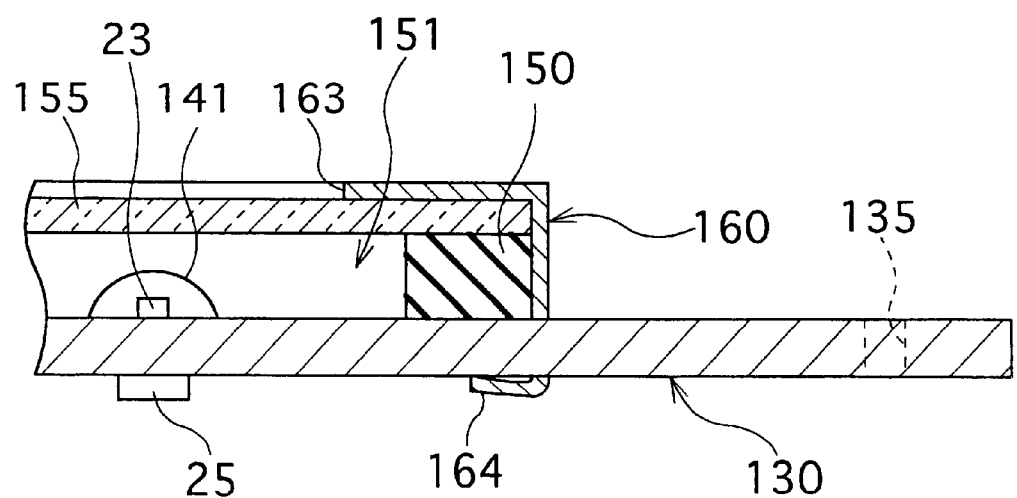
FIG. 14 is a cross-sectional view showing the cut-away part of FIG. 13 in an enlarged manner.
Figure 15:
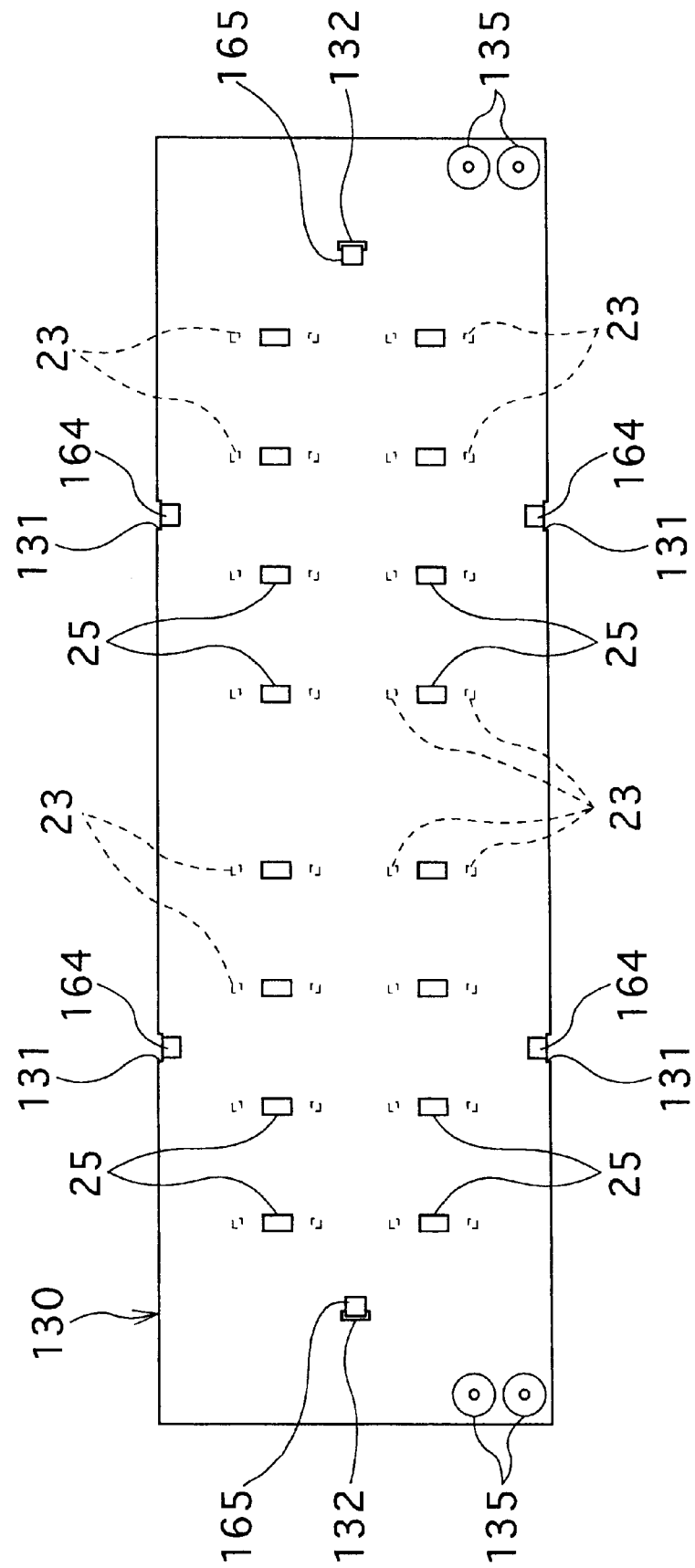
FIG. 15 is a bottom view showing the eighth embodiment of LED lamp unit.

FIG. 11 illustrates a plan view of a short-wave LED lamp unit according to a eighth embodiment of the invention. FIG. 12 illustrates a cross-section taken along the line XII—XII of FIG. 11. FIG. 13 illustrates a side elevation, cut away in part, of the eighth embodiment of LED lamp unit. FIG. 14 illustrates a cross-section of the cut-away part of FIG. 13 in an enlarged manner. FIG. 15 illustrates a bottom of the eighth embodiment of LED lamp unit.

The short-wave LED lamp unit according to the eighth embodiment has a larger size as a whole as in the seventh embodiment. In detail, the LED lamp unit has a PCB 130 on which electrical parts are mounted. As shown in FIG. 15, the PCB 130 is shaped into a flat rectangular plate. Many short-wave LED chips 23 are mounted on the PCB 130. The LED chips 23 are arranged on the upper surface (front surface) of the PCB 130 in a matrix of four lines and eight rows as a whole. Resistors 25 are mounted on the lower surface (rear surface) of the PCB 130 between the first and second lines of the LED chips 23 and between the third and fourth lines of LED chips 23, respectively. Each resistor 25 is connected in series with a pair of LED chips 23 that is located at both sides thereof. Though not shown, a zener diode is mounted on a fixed position of the lower surface of the PCB 130 for the same purpose as the first embodiment. The zener diode is connected between the anode and cathode of the LED chips 23.

Each LED chip 23 is coated with a resin mold 141 having high UV ray transmittance. The resin mold 141 is made of a transparent resin material having high UV ray transmittance, such as a silicone resin, silicone rubber, fluorine-contained resin or fluorine-contained rubber. The transparent resin material in a liquid or sol state is dripped on corresponding LED chips 23, respectively, so that the resin mold 141 coats the LED chip 23 by surface tension of the resin material. Thus, as shown in FIG. 14, the resin mold 141 is formed into a convex lens shape. A silicone JCR (unction coat resin) is preferably used as such resin mold 141. However, any material can be used as long as it has high UV ray transmittance and is hard to be degraded by the UV rays for a long time. The resin mold 141 may be colored while being transparent and having high UV transmittance, such as blue, violet or the like, for example.

A spacer 150 is placed on the upper surface of the PCB 130. The spacer 150 is made of an elastic material such as a silicone rubber. The spacer 150 is integrally formed into a rectangular ring shape with a pair of elongate rectangular accommodating spaces 151 provided at longitudinally opposite sides (right and left sides of FIG. 11). Four lines and four rows of short-wave LED chips 23 are arranged in each accommodating space 151, while the LED chip 23 is coated with the resin mold 141. Thus, the spacer 150 surrounds the LED chips 23.

Referring to FIGS. 12 and 13, a light transmitting plate 155 is placed on the upper surface of the spacer 150. The light transmitting plate 155 is made of a glass material having high UV ray transmittance, for example, the same material as that of the outer glass 31 in the first embodiment. The light transmitting plate 155 covers each accommodating space 151 entirely and faces the light emission side of the LED chips 23. The light transmitting plate 155 may be colored while being transparent and having high UV transmittance, such as blue, violet and the like.

A frame 160 is fitted on the upper surface of the PCB 130 so that the spacer 150 and light transmitting plate 155 are held between the PCB 130 and the frame 160. The frame 160 is made of a metal material, such as aluminum, into an elongate and thin rectangular box shape corresponding to an outline of the light transmitting plate 155. The frame 160 has its lower side opened and is laid over the spacer 150 and light transmitting plate 155. An upper side of the frame 160 has a grid structure formed at a portion corresponding to each accommodating space 151. Specifically, the frame 160 has three beams 161 that laterally extend to divide each of the accommodating spaces 151 into four in the longitudinal direction (right and left direction in FIG. 11). The frame 160 has crossbeams 162 that extend longitudinally and integrally formed at a lateral center between the beams 161. Thus, openings 163 are arranged in two lines and four rows, corresponding to each accommodating space 151. On the other hand, among the LED chips 23, two LED chips 23 are mounted on the upper surface of the PCB 130 so as to correspond to or face each of the openings 163. Namely, the frame 160 has the opening 163 formed at least at a portion facing the emission side of the LED chip 23 so that the light transmitting plate 155 are exposed from the opening 163. Thus, the frame 160 permits the light emitted from the LED chips 23 to go through the light transmitting plate 155.

The frame 160 has a pair of hooks 164 integrally formed on each lateral side thereof. Each pair of the hooks 164 is positioned at longitudinally opposite sides of the frame 160 so as to protrude from the lower end thereof. Moreover, the frame 160 has a pair of hooks 165 integrally formed on each longitudinal side thereof. Each hook 165 is positioned at a lateral center so as to protrude from the lower end thereof. On the other hand, the PCB 130 has fitting dents 131 formed on each longitudinal side thereof. The fitting dent 131 is located at a position corresponding to the hook 164 so that the hook 164 is fitted into the dent 131. Moreover, the PCB 130 has fitting holes 132 formed on each longitudinal side thereof. The fitting hole 132 is located at a position corresponding to the hook 165 and penetrates the PCB 130 so that the hook 165 is inserted and fitted into the hole 132. Then, each of the hooks 164 are fitted in each of the fitting dents 131 and bent thereafter. Moreover, each of the hooks 165 are inserted into each of the fitting holes 132 and bent thereafter. Thus, the frame 160 can be fitted and secured to a prescribed position of the PCB 130. The frame 160 can be easily grounded via the hooks 164, 165 and the like when making up a circuitry.

A pair of through holes 135 is formed at an outside location away from the frame 160 near each longitudinal end of the PCB 130. The through holes 135 are connected with a printed pattern formed on the front and rear surfaces of the PCB 130. An external power source supplies power to the LED chips 23 via the through holes 135.

An operation of the LED lamp unit according to the eighth embodiment is described hereunder.

With the eighth embodiment of short-wave LED lamp unit, the UV rays emitted from the LED chip 23 go through the resin mold 141 covering the LED chip 23. Since the resin mold 141 is hardly degraded by the UV ray absorption, since it has high UV ray transmittance. Moreover, the resin mold 141 protects the LED chip 23 from the mechanical shock or the like.

The resin mold 141 augments the light output efficiency, in addition to the protection effects for the LED chip 23. Namely, unless there is a resin mold 141, a light emission layer of the LED chip 23 is contacted directly with the outside air. Then, a refractive index of the light emitted from the emission layer becomes large. Thus, part of the emitted light is reflected and absorbed in the emission layer. However, if there is a resin mold 141, the refractive index of the LED chip 23 is lessened. Thus, it is possible to effectively take out the light emitted from the emission layer, which will be absorbed in the emission layer without the resin mold 141.

Moreover, the required number of LED chips 23 are mounted directly on the PCB 131 so as to make one body. Therefore, the production costs are lessened and the structure becomes simple and compact, as described in the first embodiment. Thus, the LED lamp unit can be used for general purpose more. Namely, the LED lamp unit has extended applications to the light source for photocatalyst, optical sensor, light source for fluorescent display and so on.

Particularly, the eighth embodiment of LED lamp unit is a large-sized planar light source with many LED chips 23 mounted. Therefore, it is preferably applied to uses that need a large area of UV ray radiation. For example, it is preferably used as a light source for exciting a titanium dioxide (TiO2) of an air cleaner for vehicle that utilizes the titanium dioxide as a photocatalyst. Namely, such air cleaner needs a considerable amount of light and irradiation area in order to obtain sufficient deodorizing effects. Therefore, it is effective to radiate the UV rays over a large area as in the present embodiment.

Moreover, the light transmitting plate 155 of high insulating glass material is disposed at the emission side of the LED chips 23 as in the first embodiment. Thus, the LED chips 23 and the like are prevented from trouble caused by the static electricity. Furthermore, the LED chips 23 are protected from the mechanical shock or the like by the light transmitting plate 155, too.

The PCB 130 and LED chips 23 are housed in the accommodating space 151, which is sheltered by the spacer 150 and light transmitting plate 155. Thus, they are protected from the mechanical shock or the like and prevented from deformation and trouble. In addition, the light transmitting plate 155 is covered with the frame 160, thereby being protected from the mechanical shock or the like.

The spacer 150 and light transmitting plate 155 are held between the frame 160 and the upper surface of the PCB 130 so as to make one body. Particularly, the frame 160 is easily positioned and fitted at a predetermined location of the PCB 130 by fitting the hooks 163, 164 in the fitting dents 131 and fitting holes 132. Then, it is possible to improve workability in assembling the unit. Moreover, no special parts like fasteners are necessary in assembling the unit. Thus, the total number of the parts is reduced and the structure becomes compact. Consequently, the productivity is heightened, while the production costs are lowered.

At this time, the light transmitting plate 155 is exposed from the openings 163 at least at the locations where the frame 160 faces the emission side of the LED chips 23. Thus, the light emitted from the LED chips 23 go through the light transmitting plate 155 without hindrance. Moreover, the beams 161 and crossbeams 162 act as a reinforcing frame, thereby protecting the light transmitting plate 155 from the mechanical shock and the like. As a result, the frame 160 never worsens the light emission efficiency, but sufficiently performs its protection effects.

The resin mold 141 of silicone resin or the like has high UV ray transmittance, while exhibiting proper excellent characteristics such as weather resistance or corrosion resistance. Moreover, the spacer 150 absorbs shocks between the PCB 130 and the frame 160, so that the light transmitting plate 155 is protected more effectively. Furthermore, grounding is easily realized by using the metal frame 160. Thus, it is easy to provide necessary treatments for protection of the electrical parts, e.g. prevention of static electricity.

Figure 16:
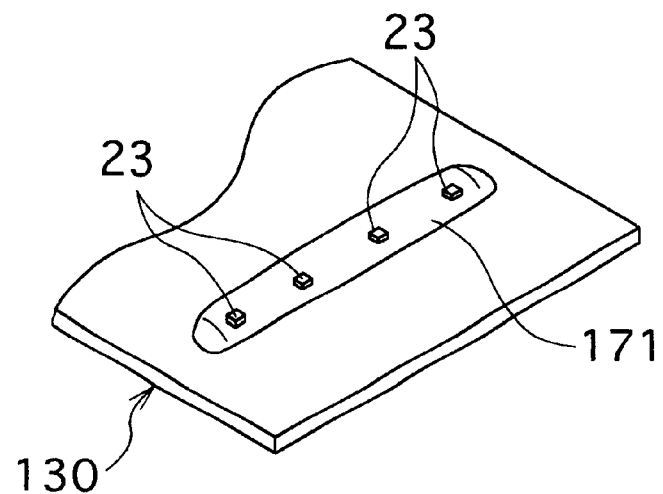
FIG. 16 is a perspective view showing a resin mold of a short-wave LED lamp unit according to a ninth embodiment of the invention.
Figure 17:
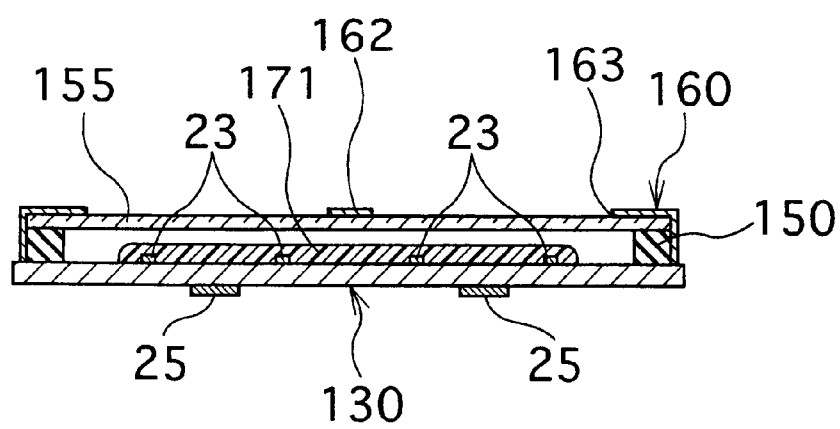
FIG. 17 is a cross-sectional view showing the ninth embodiment of LED lamp unit.

FIG. 16 illustrates a resin mold of a short-wave LED lamp unit according to a ninth embodiment of the invention. FIG. 17 illustrates the ninth embodiment of LED lamp unit.

The ninth embodiment of short-wave LED lamp unit is different from the eighth embodiment of LED lamp unit in a structure of a resin mold. The other structure is the same. Specifically, in the ninth embodiment, the resin mold 171 integrally and successively covers each row of the plural (four) LED chips 23 on the upper surface of the PCB 130. In detail, the resin mold 171 is made of the same material as the resin mold 141 of the eighth embodiment. The resin mold 171 has substantially a semi-cylindrical column shape with a length extending for each row of four LED chips 23.

The ninth embodiment of LED lamp unit operates in the same way and has the same advantages as the eighth embodiment. Moreover, with the ninth embodiment of LED lamp unit, the plural LED chips 23 can be coated as one body with the single resin mold 171. It improves the workability and heightens the productivity.

In the invention, any type of glass material can be used for the light transmitting portion of the housing, light transmitting plate or tubular housing, whether it is an organic glass material such as PMMA (acrylic resin) or MAS (copolymer of styrene and acrylic resin) or inorganic glass such as a quartz glass. Namely, any glass will serve if it has high UV ray transmittance and is hard to be degraded by the UV rays for a long time. However, in view of the productivity, costs and strength, it is preferable to use high silica glass or boro-silicate glass. It is especially preferable to use a glass material that has UV ray transmittance of about 80% or more, in case the glass is 1 mm thick, for the UV rays having a peak wavelength of about 380 nm. If a soda glass (1 mm thick) is used as the glass material in case a dome shaped LED is used as the short-wave LED, it is possible to obtain UV ray transmittance of about 90% for the UV rays having a peak wavelength of about 380 nm. If a boro-silicate glass (1 mm thick) is used as the glass material, it is possible to obtain UV ray transmittance of about 92% for the UV rays having a peak wavelength of about 380 nm. If a quartz glass is used as the glass material, it is possible to obtain higher UV ray transmittance.

The circuitry of the inventive LED lamp unit may be configured as desired. Moreover, the short-wave LED may be visible radiation short-wave LED that can emit visible rays as well as short-wave rays, other than usual short-wave LEDs that emit only the short-wave rays. Furthermore, UV rays having a peak wavelength of about 380 nm and spectrum half-band width of about 40 nm is preferable as the short-wave light. If the wavelength is shorter than that, there is a possibility that some disadvantages are caused, e.g. a resin material and fluorescent paint of a dial is degraded in short time if the LED lamp unit is applied to a vehicle meter. On the other hand, if the wavelength is longer than that, it is possible that a fluorescent material is not excited enough so that fluorescent light at characters or scales of the dial becomes weak. More advantageous effects are obtained if an LED having a peak wavelength of about 380 nm and half-band width of about 20 nm is used as the short-wave LED. Indium gallium nitride LED is preferably used as such short-wave LED, for example. Aluminum gallium nitride (AlxGa1-xN) LED can be used as such short-wave LED, too.

The number, area and manner in disposing the LED chips 23 are appropriately set depending on conditions such as required light quantity, irradiation range or irradiation area. The eighth and ninth embodiments can be concretized into an LED lamp unit in which the light transmitting plate 155 is omitted. In this case, the proper advantages are obtained such as the protection of the LED chips 23 by the resin mold 141, 171 or the improvement of the light output efficiency. Namely, the invention may be practiced in an embodiment that has at least the PCB 130, short-wave LED chip 23 and resin mold 141, 171.

The frame 160 may omit one of the beams 161 and cross-beams 162. The frame 160 may change the number or disposition of the beams 161 and cross-beams 162. For example, while the above embodiment of beams 161 and cross-beams 162 define a rectangular grid, another shape of beams or openings may be arranged on the upper side of the frame, such as a hexagonal grid. A protective plate of punching metal may be disposed on the upper side of the fame 160. It is preferable to increase the number and density of the beams 161 and cross-beams 162 in order to guard the light transmitting plate 155 more effectively. On the other hand, it is preferable to decrease the number and density of the beams 161 and cross-beams 162 in order to effectively utilize the light emission from the LED 23. However, if it is unnecessary to take the protection of the light transmitting plate 155 into account, both the beams 161 and cross-beams 162 may be omitted.

In the first to seventh embodiments, the resin mold 141, 171 may be provided on the LED chips 23 as in the eighth embodiment. Moreover, in the first or seventh embodiment, a reinforcing grid or beam may be disposed at the opening 11, 81 of the housing 10, 80 like the beams 161 or cross-beams 162.

The first, seventh, eighth and ninth embodiments may omit the light transmitting plate 31, 111, 155, while providing the resin mold 141, 171 on the LED chips 23 and protecting the LED chips 23 by the housing 10, 80 with the beams 161 and cross-beams 162 or frame 160.

The preferred embodiments described herein are illustrative and not restrictive, the scope of the invention being indicated in the appended claims and all variations which come within the meaning of the claims are intended to be embraced therein.

What is claimed is:

1. A short-wave light emitting diode lamp unit comprising:
   a printed circuit board on which electronic parts are mountable;
   a plurality of short-wave light emitting diode chips mounted on the printed circuit board; and
   a housing accommodating therein the printed circuit board and the short-wave light emitting diode chips, while having a light transmitting portion provided at least at a location facing a light emission side of the short-wave light emitting diode chip, the light transmitting portion being made of a glass material having high ultraviolet ray transmittance of about 80% or more for ultraviolet rays having a peak wavelength of about 380 nm.

2. A short-wave light emitting diode lamp unit comprising:
   a housing having an opening;
   a printed circuit board on which electronic parts are mountable, the printed circuit board being disposed inside the housing;
   a plurality of short-wave light emitting diode chips mounted on the printed circuit board so that a light emission side of the short-wave light emitting diode chip faces the opening of the housing; and
   a light transmitting plate attached to the opening of the housing, the light transmitting plate being made of a glass material having high ultraviolet ray transmittance of about 80% or more for ultraviolet rays having a peak wavelength of about 380 nm.

3. A short-wave light emitting diode lamp unit comprising:
   a printed circuit board on which electronic parts are mountable;
   a plurality of short-wave light emitting diode chips mounted on the printed circuit board; and
   a housing accommodating therein the printed circuit board and the short-wave light emitting diode chips, the housing being made into a tube shape of a glass material having high ultraviolet transmittance of about 80% or more for ultraviolet rays having a peak wavelength of about 380 nm.

4. A short-wave light emitting diode lamp unit according to claim 1, in which the housing has an airtight structure and is filled with a nitrogen gas therein.

5. A short-wave light emitting diode lamp unit according to claim 1, further comprising a protective film formed on a surface of the short-wave light emitting diode chip, the protective film being made of a transparent resin material having high ultraviolet ray transmittance.

6. A short-wave light emitting diode lamp unit according to claim 1, further comprising a photocatalyst film formed on th e light transmitting portion.

7. A short-wave light emitting diode lamp unit comprising:
   a printed circuit board on which electronic parts are mountable;
   a plurality of short-wave light emitting diode chips mounted on the printed circuit board; and
   a resin mold coating the short-wave light emitting diode chip, the resin mold having high ultraviolet ray transmittance.

8. A short-wave light emitting diode lamp unit according to claim 7, further comprising a housing accommodating therein the printed circuit board and the short-wave light emitting diode chips, while having a light transmitting portion provided at least at a location facing a light emission side of the short-wave light emitting diode chip, the light transmitting portion being made of a glass material having high ultraviolet ray transmittance of about 80% or more for ultraviolet rays having a peak wavelength of about 380 nm.

9. A short-wave light emitting diode lamp unit according to claim 7, further comprising:
- a spacer placed on an upper surface of the printed circuit board so as to define an accommodating space surrounding the short-wave light emitting diode chips;
- a light transmitting plate placed on an upper surface of the spacer so as to shield the accommodating space of the spacer, while facing a light emission side of the short-wave light emitting diode chip, the light transmitting plate being made of a glass material having high ultraviolet ray transmittance of about 80% or more for ultraviolet rays having a peak wavelength of about 380 nm; and
- a frame fitted on an upper side of the printed circuit board so that the spacer and the light transmitting plate are held between the printed circuit board and the frame and so that the frame covers an upper surface of the light transmitting plate, the frame having an opening formed at least at a location facing a light emission side of the short-wave light emitting diode chip so as to make the light transmitting plate exposed thereat, thereby permitting a light emitted from the short-wave light emitting diode chip going through the light transmitting plate via the opening.

10. A short-wave light emitting diode lamp unit according to claim 7, in which the resin mold is made of one of a silicone resin, silicone rubber, fluorine-contained resin and fluorine-contained rubber.

11. A short-wave light emitting diode lamp unit according to claim 7, in which the short-wave light emitting diode chips are arrange in a matrix on the printed circuit board, and the resin mold coats each row or each line of the short-wave light emitting diode chips successively and integrally.

\* \* \* \* \*